(12) United States Patent
Wuu et al.

(10) Patent No.: US 10,431,517 B2
(45) Date of Patent: Oct. 1, 2019

(54) ARRANGEMENT AND THERMAL MANAGEMENT OF 3D STACKED DIES

(71) Applicants: John Wuu, Fort Collins, CO (US); Samuel Naffziger, Fort Collins, CO (US); Patrick J. Shyvers, Fort Collins, CO (US); Milind S. Bhagavat, Los Altos, CA (US); Kaushik Mysore, Austin, TX (US); Brett P. Wilkerson, Austin, TX (US)

(72) Inventors: John Wuu, Fort Collins, CO (US); Samuel Naffziger, Fort Collins, CO (US); Patrick J. Shyvers, Fort Collins, CO (US); Milind S. Bhagavat, Los Altos, CA (US); Kaushik Mysore, Austin, TX (US); Brett P. Wilkerson, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/686,558

(22) Filed: Aug. 25, 2017

(65) Prior Publication Data
US 2019/0067152 A1    Feb. 28, 2019

(51) Int. Cl.
*H01L 23/367* (2006.01)
*H01L 25/00* (2006.01)
*H01L 25/065* (2006.01)
*H01L 23/36* (2006.01)
*H01L 23/373* (2006.01)

(52) U.S. Cl.
CPC ............ *H01L 23/367* (2013.01); *H01L 23/36* (2013.01); *H01L 25/0657* (2013.01); *H01L 25/50* (2013.01); *H01L 23/373* (2013.01); *H01L 23/3732* (2013.01); *H01L 23/3736* (2013.01); *H01L 23/3737* (2013.01); *H01L 2224/16145* (2013.01); *H01L 2224/16225* (2013.01); *H01L 2225/06589* (2013.01); *H01L 2924/15311* (2013.01); *H01L 2924/181* (2013.01); *H01L 2924/18161* (2013.01)

(58) Field of Classification Search
CPC ...................................................... H01L 23/367
USPC .......................................................... 257/712
See application file for complete search history.

(56) References Cited

U.S. PATENT DOCUMENTS 3,761,310 A * 9/1973 Preobrazhentsev ..... H01L 21/00
257/746
6,219,243 B1 * 4/2001 Ma .......................... H01L 23/36
257/706

(Continued)

OTHER PUBLICATIONS

USPTO Office Action notification dated Oct. 1, 2018; U.S. Appl. No. 15/844,575.

(Continued)

*Primary Examiner* — Jami Valentine Miller
(74) *Attorney, Agent, or Firm* — Timothy M. Honeycutt

(57) ABSTRACT

Various semiconductor chip devices with stacked chips are disclosed. In one aspect, a semiconductor chip device is provided. The semiconductor chip device includes a first semiconductor chip that has a floor plan with a high heat producing area and a low heat producing area. At least one second semiconductor chip is stacked on the low heat producing area. The semiconductor chip device also includes means for transferring heat from the high heat producing area.

14 Claims, 9 Drawing Sheets

(56) References Cited

U.S. PATENT DOCUMENTS

| | | | |
|---|---|---|---|
| 8,779,599 | B2 | 7/2014 | Lin et al. |
| 9,224,697 | B1 | 12/2015 | Kwon et al. |
| 9,258,890 | B2 | 2/2016 | Seguido et al. |
| 9,613,931 | B2 | 4/2017 | Lin et al. |
| 2009/0243086 | A1* | 10/2009 | Warren ............... H01L 23/4334 257/712 |
| 2012/0043669 | A1* | 2/2012 | Refai-Ahmed ......... H01L 23/04 257/777 |
| 2014/0312491 | A1* | 10/2014 | Jin ........................ H01L 23/481 257/737 |
| 2015/0311182 | A1 | 10/2015 | Lee et al. |
| 2016/0070318 | A1* | 3/2016 | Wu .......................... G06F 1/20 361/679.54 |
| 2018/0012857 | A1* | 1/2018 | Lin ....................... H01L 21/561 |
| 2018/0138101 | A1 | 5/2018 | Yu et al. |
| 2019/0006263 | A1* | 1/2019 | Yu ....................... H01L 23/3738 |

OTHER PUBLICATIONS

Sandeep Kumar Samal et al.; *Adaptive Regression-Based Thermal Modeling and Optimization for Monolithic 3-D ICs*; IEEE Transactions on Computer-Aided Design of Integrated Circuits and Systems; vol. 35; No. 10; Oct. 2016; pp. 1707-1720.

U.S. Appl. No. 15/844,575, filed Dec. 17, 2017, Agarwal et al.

\* cited by examiner

ARRANGEMENT AND THERMAL MANAGEMENT OF 3D STACKED DIES

BACKGROUND OF THE INVENTION

Many current integrated circuits are formed as multiple dice on a common wafer. After the basic process steps to form the circuits on the dice are complete, the individual die are singulated from the wafer. The singulated die are then usually mounted to structures, such as circuit boards, or packaged in some form of enclosure.

One frequently-used package consists of a substrate upon which a die is mounted. The upper surface of the substrate includes electrical interconnects. The die is manufactured with a plurality of bond pads. A collection of solder joints are provided between the bond pads of the die and the substrate interconnects to establish ohmic contact. After the die is mounted to the substrate, a lid is attached to the substrate to cover the die. Some conventional integrated circuits, such as microprocessors, generate sizeable quantities of heat that must be transferred away to avoid device shutdown or damage. The lid serves as both a protective cover and a heat transfer pathway.

Stacked dice arrangements involve placing or stacking one or more semiconductor chips on a base semiconductor chip. In some conventional variants, the base semiconductor chip is a high heat dissipating device, such as a microprocessor. The stacked chips are sometimes memory devices. In a typical conventional microprocessor design, the chip itself has a floor plan with various types of logic blocks, such as floating point, integer, I/O management, and cache blocks frequently interspersed among each other. The power densities of the blocks vary: some have relatively higher power densities and some have relatively lower power densities.

BRIEF DESCRIPTION OF THE DRAWINGS

The foregoing and other advantages of the invention will become apparent upon reading the following detailed description and upon reference to the drawings in which.

DETAILED DESCRIPTION

Figure 1:
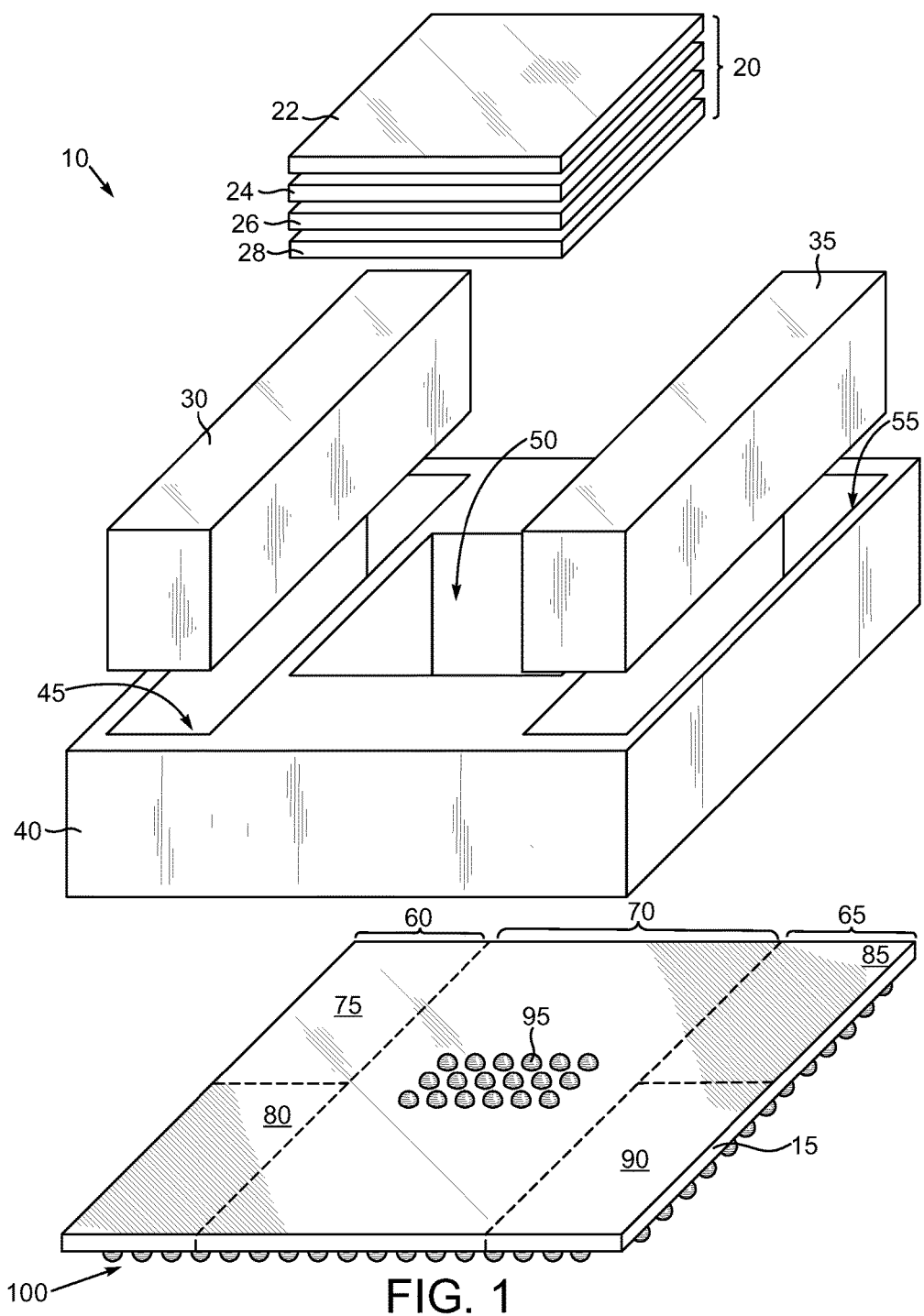
FIG. 1 is an exploded pictorial view of an exemplary semiconductor chip device includes a semiconductor chip and a stack of semiconductor chips positioned thereon.

Stacked semiconductor chip devices present a host of design and integration challenges for scientists and engineers. Common problems include providing adequate electrical interfaces between the stacked semiconductor chips themselves and between the individual chips and some type of circuit board, such as a motherboard or semiconductor chip package substrate, to which the semiconductor chips are mounted. Another critical design issue associated with stacked semiconductor chips is thermal management. Most electrical devices dissipate heat as a result of resistive losses, and semiconductor chips and the circuit boards that carry them are no exception. Still another technical challenge associated with stacked semiconductor chips is testing.

A process flow to transform a bare semiconductor wafer into a collection of chips and then mount those chips on packages or other boards involves a large number of individual steps. Because the processing and mounting of a semiconductor chip proceeds in a generally linear fashion, that is, various steps are usually performed in a specific order, it is desirable to be able to identify defective parts as early in a flow as possible. In this way, defective parts may be identified so that they do not undergo needless additional processing. This economic incentive to identify defective parts as early in the processing phase as possible is certainly present in the design and manufacture of stacked semiconductor chip devices.

Thermal management of semiconductor chips in a stacked arrangement remains a technical challenge during required electrical testing and operation of one or more of the semiconductor chips. A given semiconductor chip in a stacked arrangement, whether the first, an intermediary or the last in the particular stack, may dissipate heat to such an extent that active thermal management is necessary in order to either prevent the one or all of the semiconductor chips in the stack from entering thermal runaway or so that one or more of the semiconductor chips in the stack may be electrically tested at near or true operational power levels and frequencies.

One possible solution for thermal dissipation with stacks including high powered processors involves placing the processor as the top die in a stack of dies (i.e. closest to heat sink), although such techniques introduce a new power delivery challenge. Power, ground and signals will require routing up through the underlying lower power dies. This requires dense microbumps and through-silicon-vias (TSVs) through the stacked dies, which represents significant area overheads for the stacked dies.

In accordance with one aspect of the present invention, a semiconductor chip device is provided. The semiconductor chip device includes a first semiconductor chip that has a floor plan with a high heat producing area and a low heat producing area. At least one second semiconductor chip is stacked on the low heat producing area. The semiconductor chip device also includes means for transferring heat from the high heat producing area.

In accordance with another aspect of the present invention, a semiconductor chip device is provided. The semiconductor chip device includes a first semiconductor chip that has a floor plan with a high heat producing area and a low heat producing area. At least one second semiconductor chip is stacked on the low heat producing area. A dummy component is mounted on the high heat producing area to transferring heat from the high heat producing area. A molding material at least partially encapsulates the dummy component and the at least one second semiconductor chip.

In accordance with another aspect of the present invention, a method of manufacturing a semiconductor chip device is provided. The method includes stacking at least one first semiconductor chip on a second semiconductor chip. The second semiconductor chip has a floor plan with a high heat producing area and a low heat producing area. The at least one first semiconductor chip is stacked on the low heat producing area. Means for transferring heat from the high heat producing area is mounted on the high heat producing area.

In the drawings described below, reference numerals are generally repeated where identical elements appear in more than one figure. Turning now to the drawings, and in particular to FIG. 1, therein is depicted an exploded pictorial view of an exemplary semiconductor chip device 10 that includes a semiconductor chip 15, a stack 20 of semiconductor chips 22, 24, 26 and 28 that are stacked on the semiconductor chip 15 and one or more dummy components 30 and 35 that are mounted at select locations on the semiconductor chip 15 for thermal management purposes. The stack can number one or more chips 22, 24 etc. The dummy components 30 and 35 as well as the semiconductor chip stack 20 may be at least partially encased by a molding material 40. Various openings 45, 50 and 55 in the molding material 40 are depicted simply to show where within the molding material 40 the chip stack 20 and the dummy components 30 and 35 are positioned after molding the molding material 40.

The semiconductor chip 15 has a floor plan that includes two high heat producing areas 60 and 65 positioned to either side of a centrally located low heat producing area 70. As used herein, the terms "high" and "low" signify that the low high heat producing area 70 generates less heat than the either or the combination of the high heat producing portions 60 and 65. The high heat producing area 60 can be a processor core containing portion that contains, for example, processor cores 75 and 80. A processor core is an execution portion of the semiconductor chip 15. The high heat producing area 65 can similarly be a processor core containing portion that contains, for example, processor cores 85 and 90. It should also be understood that greater than four total cores, such as the core 75, 80, 85 and 90 depicted, can be implemented in the semiconductor chip 15. Of course, other arrangements can be logic other processor cores. The low heat producing area 70 can include bus logic, I/O logic, cache logic or the like. A technical goal of establishing the depicted footprint or floor plan for the semiconductor chip 15 is to, at the layout design phase, position the low heat producing area 70 in a separate location from the high heat producing areas 60 and 65 so that the chip stack 20 can be mounted where there is relatively lesser heat dissipation. Thus, the chip stack 20 is advantageously positioned on the low heat producing area 70 and interconnected to the semiconductor chip 15 by way of plural interconnects 95. The interconnects can be solder bumps, solder micro-bumps, conductive pillars or other interconnects. Well-known lead free solders, such as Sn—Ag, Sn—Ag—Cu or others can be used. Conductive pillars of copper, gold, aluminum, combinations of the these or like can be used with or without solder caps. To interface electrically with another component such as a circuit board or other device, the semiconductor chip 15 can include plural I/O structures 100. The I/O structures 100 can be solder balls, solder bumps, conductive pillars, or other types of interconnect structures.

Figure 2:
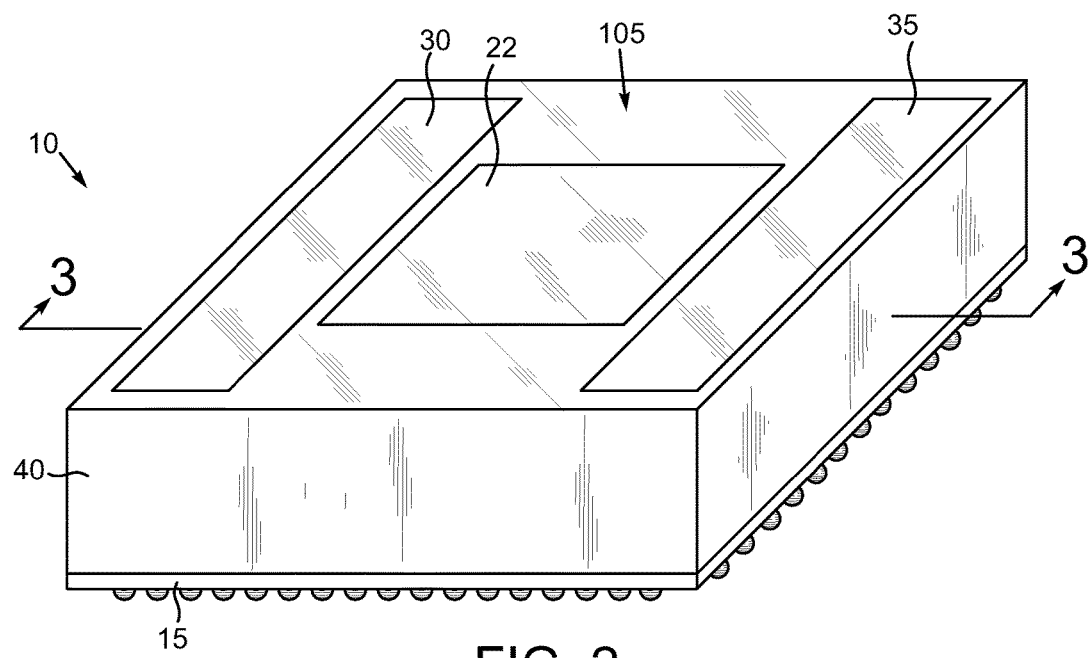
FIG. 2 is an unexploded version of the FIG. 1 pictorial.

FIG. 2 shows a pictorial view of the fully assembled semiconductor chip device 10. As noted above, the molding material 40 at least partially encapsulates the dummy components 30 and 35 and the chip stack 20. Here, the upper surface 105 of the molding material 40 may be coplanar with the upper surfaces of the dummy components 30 and 35 and the top most chip 22 of the chip stack 20. It should be understood that the floor plan of the semiconductor chip 15 can vary greatly and the techniques described herein still utilized to positive effect so long as there is a high heat producing area, such as the area 60, and a low heat producing area, such as the area 70. Again, a technical goal is to be able to segregate high and low heat producing logic so that the chip stack 20 can be mounted on the low heat producing area 70.

Figure 3:
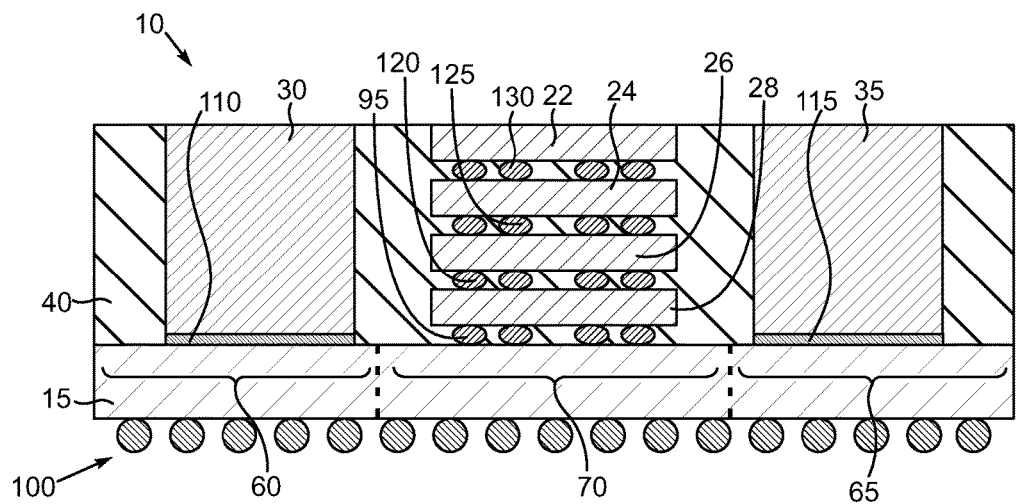
FIG. 3 is a sectional view of FIG. 2 taken at section 2-2.

Additional details of the semiconductor chip device 10 can be understood by referring now also to FIG. 3, which is a sectional view of FIG. 2 taken at section 3-3. The dummy components 30 and 35 are thermally and mechanically connected to the semiconductor chip 15 by way of respective thermal interface films 110 and 115. The thermal interface films 110 and 115 can be an adhesive, such as an epoxy, an organic TIM, such as silicone rubber mixed with aluminum particles and zinc oxide. Compliant base materials other than silicone rubber and thermally conductive particles other than aluminum may be used. Thermal greases and gold, platinum and silver represent a few examples. In other arrangements the thermal interface films 110 and 115 can be nanofoils composed of layers of aluminum and nickel. As noted above, the dummy components 30 and 35 are preferably positioned on the high heat producing areas 60 and 65 of the semiconductor chip 15 while the chip stack 20 is preferably mounted on the low heat producing area 70 of the semiconductor chip 15. It is desirable for the materials selected for the molding material to exhibit suitable viscosity at the applicable molding temperatures and have molding temperatures lower than the melting points of any of the solder structures present at the time of the molding processes. In an exemplary arrangement the materials for the molding material 40 can have a molding temperature of about 165° C. Two commercial variants are Sumitomo EME-G750 and G760. Well-known compression molding techniques can be used to mold the molding material 40.

The lowermost semiconductor chip 28 of the chip stack 20 is electrically connected and mechanically mounted to the semiconductor chip 15 by way of the plural interconnect structures 95. The semiconductor chip 26 can be secured to the semiconductor chip 28 by an additional set of interconnects 120, which can be like the interconnects 95. Similar sets of interconnects 125 and 130 can be positioned between the semiconductor chips 24 and 26 and 22 and 24. If the chips 22, 24, 26 and 28 are stacked together prior to mounting on the semiconductor chip 15, then it is desirable for the interconnects 95 to have a lower reflow temperature than the interconnects 120, 125 and 130 to ensure that the reflow of the interconnects 95 during mounting of the stack 20 does not melt or otherwise damage the interconnects 120, 125 and 130. However, if the chip 28 is mounted first on the semiconductor chip 15 followed by the chips 26, 24 and 22 in sequence, then the interconnects 95 should have the higher of the reflow temperatures. As noted above, the I/O structures 100 can be used to interface the semiconductor chip 15 electrically with another device not shown. The semiconductor chips 22, 24, 26 and 28 include through-silicon-vias (not shown) to provide through-chip pathways. In this way, data can be shared between the chips 22, 24, 26 and 28 and with the semiconductor chip 15.

As noted elsewhere herein, the interconnects 85, 120, 125 and 130 can take on a variety of alternative forms. For example, conductive pillars on each of two adjacent stacked chips can be thermal compression bonded. In another alternative arrangement, direction oxide bond and TSV last connection can be used. In this technique, facing sides of each two adjacent stacked chips each receive an oxide film. The oxide films are subsequently planarized using chemical mechanical polishing and then plasma treated to become hydrophillic. The oxide surfaces are next placed together and annealed to form a bond. Thereafter, one of the chips is thinned by backgrinding. TSV etches and metal deposition or plating are then used to establish TSVs in contact with various I/O pads of each chip. In yet another alternative arrangement, a hybrid bonding technique is used. Again, facing oxide films are formed on each of two adjacent chips. But conductive islands of copper or otherwise are interspersed in the oxide films. The chips are stacked with the respective conductive islands aligned vertically and a heating process in excess of about 200° C. is performed to bond the conductive islands together.

The dummy components 30 and 35 provide a conductive heat transfer pathway upward from the high heat producing areas 60 and 65. In this way, a heat spreader of one sort or another can be eventually positioned on the dummy components 30 and 35 and also placed in thermal contact with the top most semiconductor chip 22 to convey heat away from the high heat producing areas 60 and 65 and even the low heat producing area 70. The dummy components can be composed of silicon, copper, graphite, sapphire, diamond or other thermally conducting materials. Silicon is relatively inexpensive.

Figure 4:
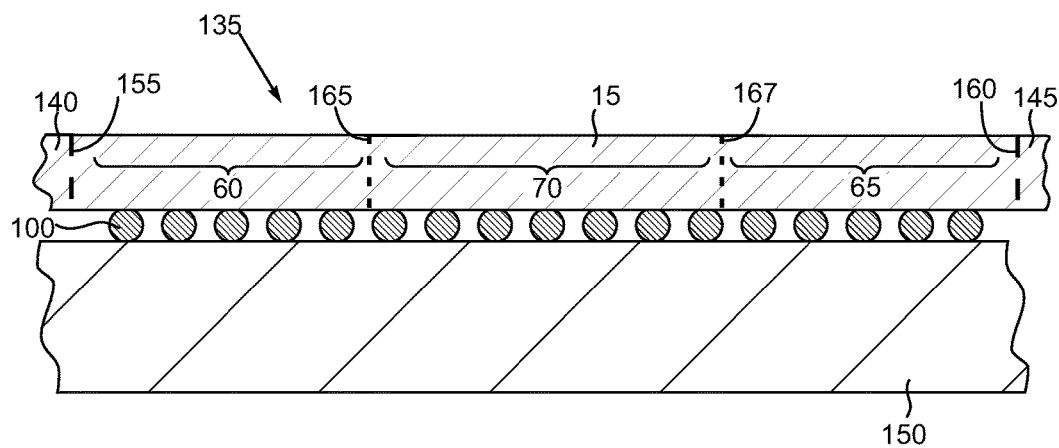
FIG. 4 is a sectional view of an exemplary semiconductor wafer following initial processing.

An exemplary method of fabricating the semiconductor chip device 10 may be understood by referring now to FIGS. 4, 5, 6, 7, 8 and 9 and initially to FIG. 4, which is a sectional view of the semiconductor chip 15 at a certain point in processing. The semiconductor chip device 10 is advantageously fabricated as a wafer level process and thus is initially a part of a semiconductor wafer 135. Therefore, the semiconductor chip 15 is depicted along with small portions of adjacent semiconductor chips 140 and 145 of the wafer 135 all positioned temporarily on a carrier wafer 150 composed of glass or other materials and secured thereto by, for example, a light-activated adhesive (not shown). The dashed lines 155 and 160 indicate the positions of dicing streets and the dashed lines 165 and 167 indicate the approximate borders between the low heat producing area 70 and the high heat producing areas 60 and 65. The semiconductor chip 15 has undergone a myriad of different types of semiconductor processes to fabricate the various logic devices and other interconnects, etc. for the high heat producing areas 60 and 65 and the low heat producing area 70. In addition, the I/O structures 100 have been mounted to the semiconductor chip 15 and to the other chips 140 and 145 as well. At this point, the semiconductor wafer 135 is mounted to the carrier wafer 150, which will be used to provide mechanical support for the semiconductor wafer 135 during various process steps to be described in more detail below.

Figure 5:
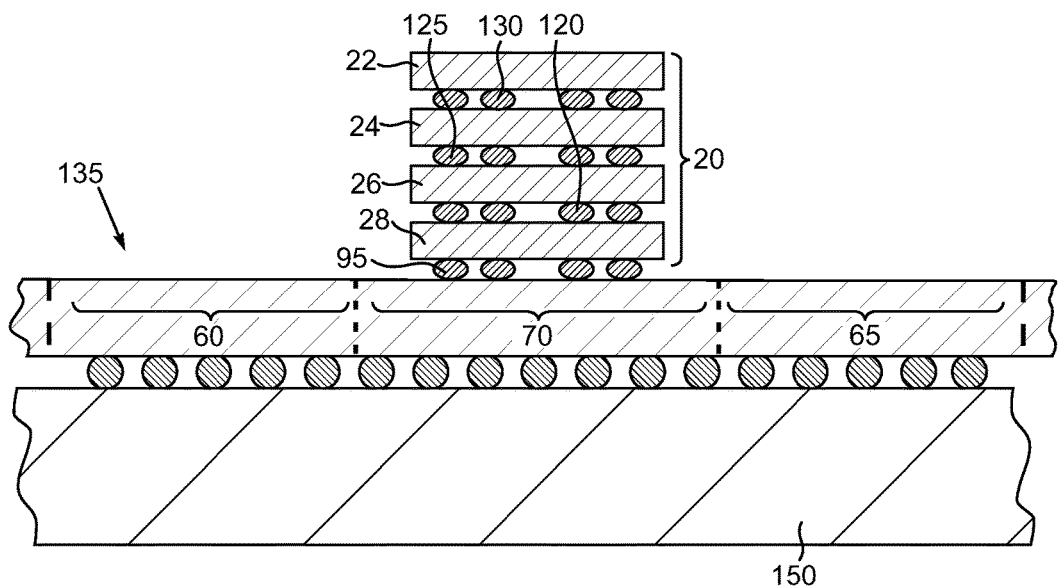
FIG. 5 is a sectional view like FIG. 4, but depicting exemplary chip stacking on the wafer.

As shown in FIG. 5, the chip stack 20 is mounted on the semiconductor chip 15, and it should be understood that the processes about to be described can be replicated across the entirety of the semiconductor wafer 135. In any event, the chip stack 20 can be mounted en masse and a suitable reflow process used to establish metallurgical connections between the interconnects 95 of the semiconductor chip 28 and the semiconductor chip 15. The chip stack 20 can also be mounted on the semiconductor chip 15 sequentially, that is one chip 28, 26, 24 and 22, at a time, if desired. As noted above, the chip stack 20 is advantageously positioned on the low heat producing area 70 and thus outside the high heat producing areas 60 and 65.

Figure 6:
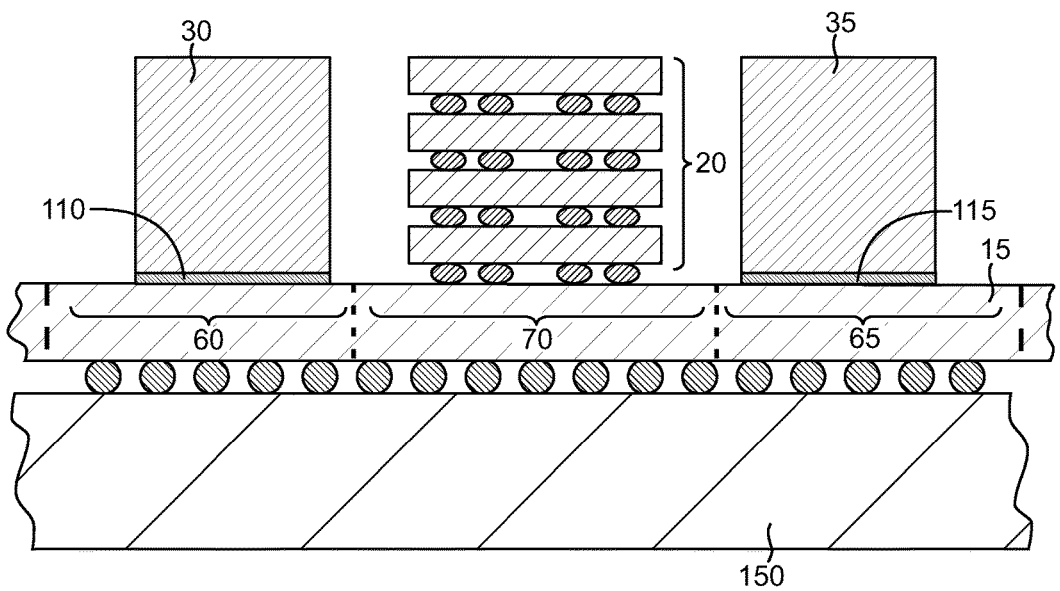
FIG. 6 is a sectional view like FIG. 5, but depicting exemplary dummy component mounting on the wafer.

Next and as shown in FIG. 6, the dummy components 30 and 35 are mounted on the respective high heat producing areas 60 and 65 of the semiconductor chip 15. As noted above, the thermal interface layers 110 and 115 are positioned between the dummy components 30 and 35 and the semiconductor chip 15. These films 110 and 115 can be positioned first on the semiconductor chip 15 and thereafter the dummy silicon components 30 and 35 can be stacked thereon or they can be positioned first on the dummy components 30 and 35 and thereafter the combinations thereof positioned on the semiconductor chip 15. Again, throughout these steps the carrier wafer 150 is used for mechanical support and protection of the I/O structures 100 of the chip 15.

Figure 7:
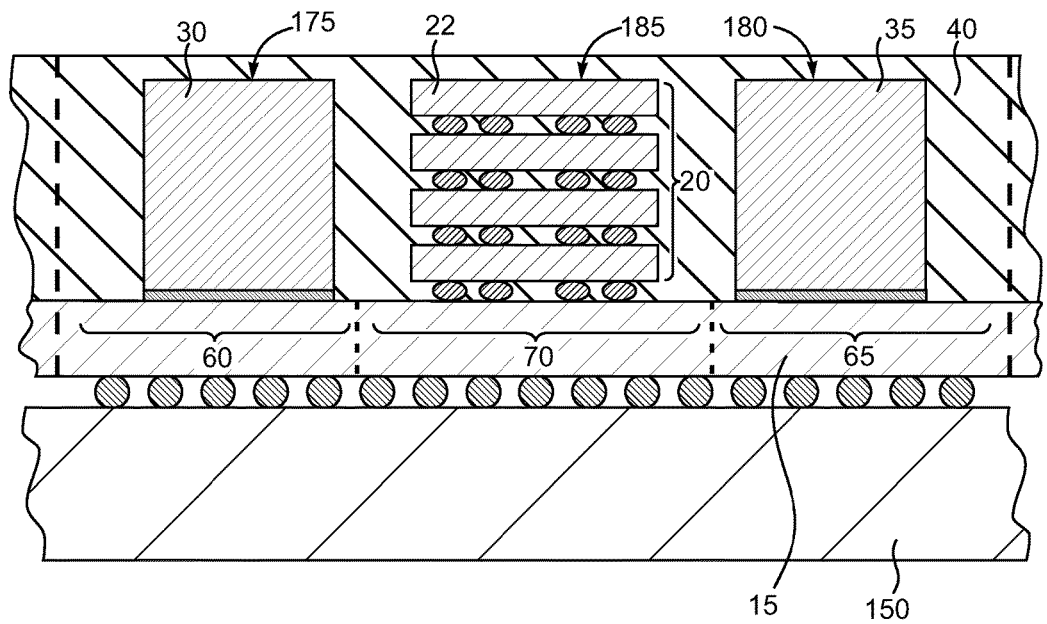
FIG. 7 is a sectional view like FIG. 6, but depicting exemplary molding material application.
Figure 8:
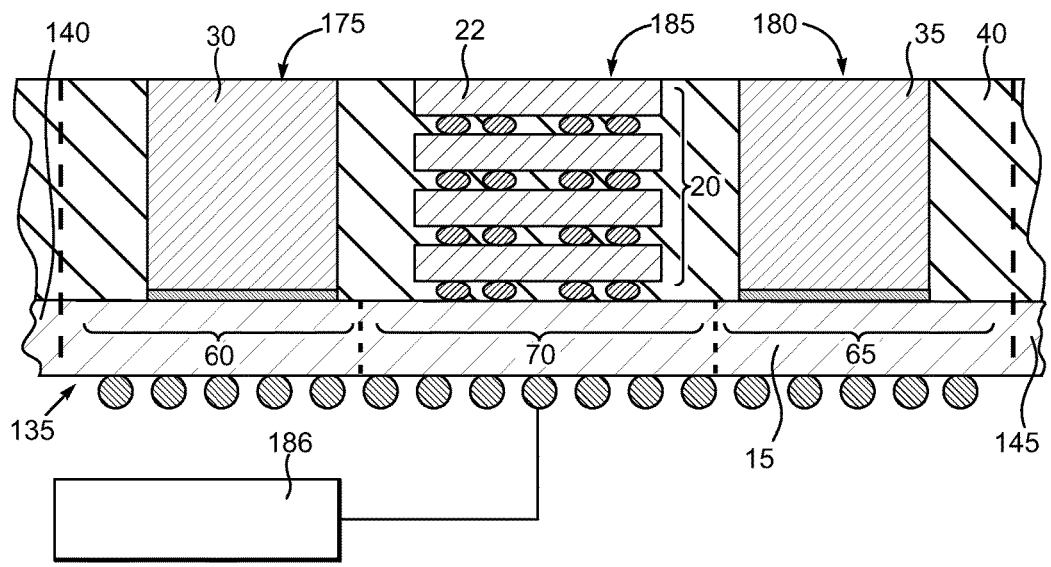
FIG. 8 is a sectional view like FIG. 7, but depicting exemplary molding material planarization and optional electrical testing.
Figure 9:
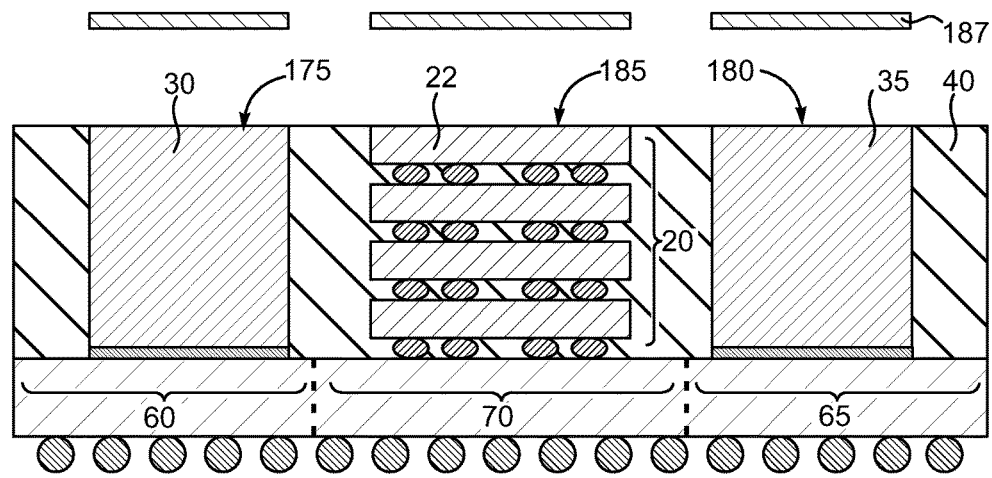
FIG. 9 is a sectional view like FIG. 8, but depicting exemplary wafer singulation and optional backside metallization application.

Next and as shown in FIG. 7, the molding material 40 is formed on the semiconductor chip 15 and around the dummy components 30 and 35 and the chip stack 20. The molding material 40 is advantageously formed by way of well-known compression molding techniques and is done so to at least initially encapsulate the dummy components 30 and 35 and the chip stack 20. A subsequent grinding process will be used to expose the upper surfaces 175 and 180 of the dummy components 30 and 35 and the upper surface 185 of the top most semiconductor chip 22. Next and as shown in FIG. 8, a grinding process is performed on the molding material 40 to expose and make planar the aforementioned upper surfaces 175 and 180 of the dummy components 30 and 35 and the upper surface 185 of the top most semiconductor chip 22. In addition, at this point the carrier substrate 150 is removed by deactivating the aforementioned light activated adhesive. At this point, the wafer 135 can be subjected to various testing using test devices, one of which is depicted in block form and labeled 186. The testing device 186 can be a probe tester or other device. The molding material 40 provides a robust mechanical stress support to protect the relatively thin but wide wafer 135 during handling and testing.

At this point, the semiconductor chip device 10 that includes the semiconductor chip 15, the dummy components 30 and 35, the chip stack 20 and the molding material 40 is ready to be singulated from the other portions (the adjacent chips 140 and 145) of the semiconductor wafer 135 and the adjacent portions of the molding 40. The singulation process can be conducted using mechanical sawing, laser cutting or combinations of these or other cutting techniques and yields the completed semiconductor chip device 10 depicted in FIG. 9. At this stage, the upper surfaces 175 and 180 of the dummy components 30 and 35 as well as the upper surface 185 of the top most chip 22 of the chip stack 20 are ready to have a heat spreader mounted thereon. An optional backside metallization 187 can be applied to the top semiconductor chip 22 and the dummy components 30 and 35 if a solder-type thermal interface material is contemplated for a subsequently installed heat spreader. The backside metallization 187 can take on a variety of arrangements and compositions. One exemplary arrangement includes a lowermost sputtered layer of aluminum, followed in succession by sputtered layers of titanium, then nickel-vanadium, and finally gold. Suitable resist masking (not shown) is used in conjunction with the sputtering.

Figure 10:
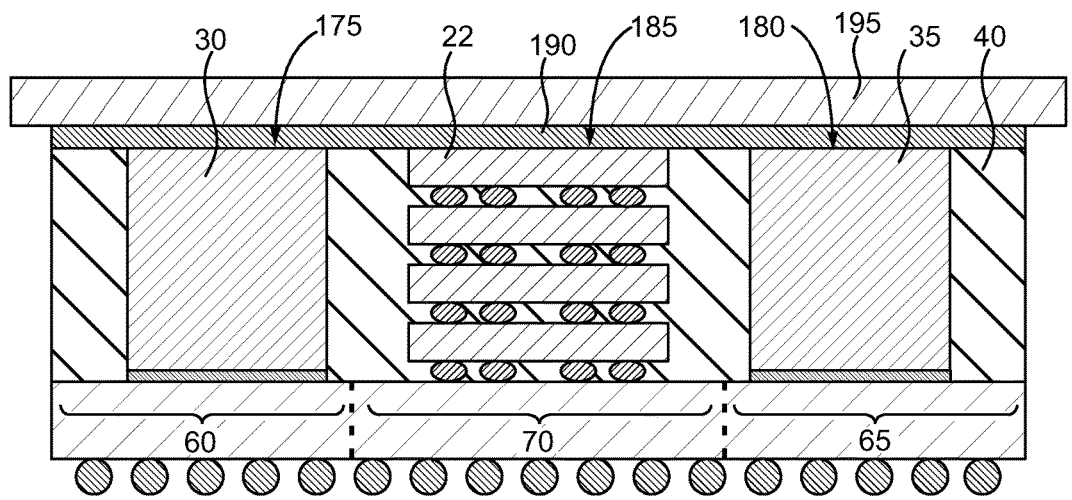
FIG. 10 is a sectional view like FIG. 9, but depicting exemplary heat spreader application.

Thus, and as shown in FIG. 10, a thermal interface material 190 is positioned between a heat spreader 195 and the upper surfaces 175, 180 and 185 of the dummy semiconductor components 30 and 35 and the top most chip 22, respectively. The heat spreader 195 can be composed of well-known thermal management device materials such as copper, aluminum, diamond or other types of materials. The thermal interface material 190 can be any of a variety of well-known organic thermal interface materials, such as, silicone rubber, thermal greases, or even a solder material, such as indium or various types of tin solders.

Figure 11:
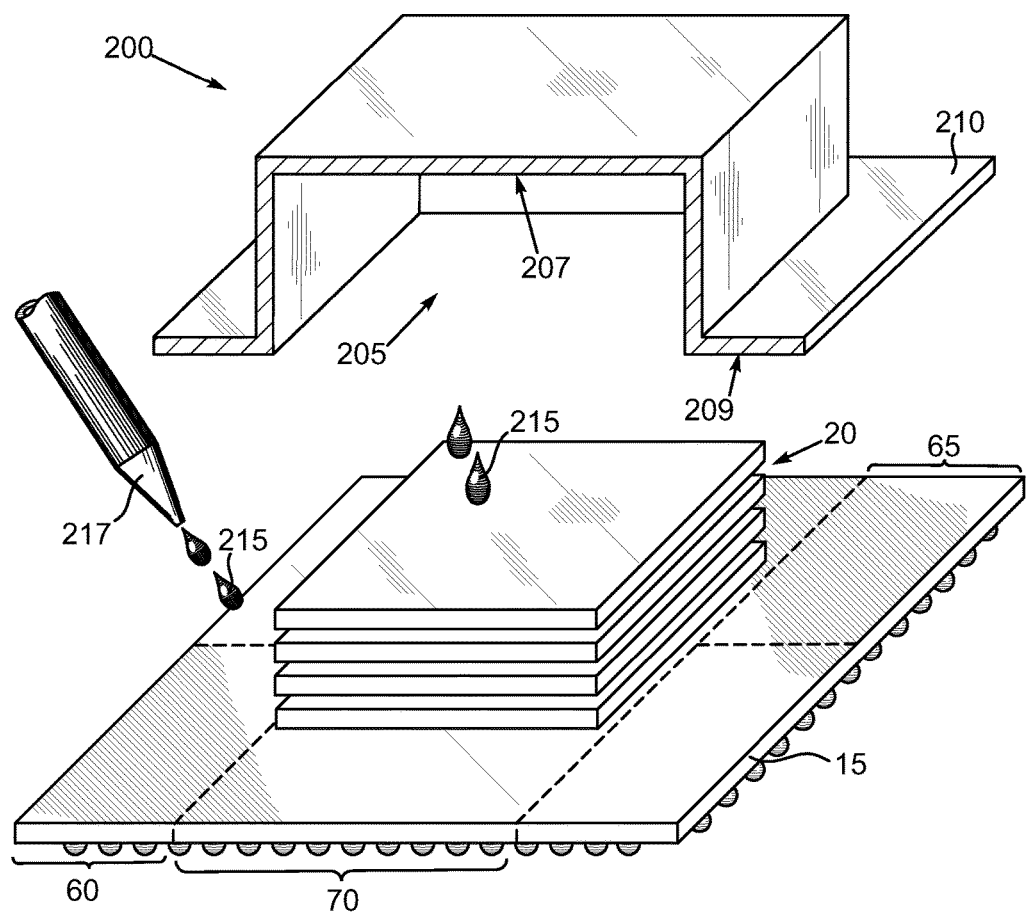
FIG. 11 is a partially exploded pictorial view of an exemplary semiconductor chip device and heat spreader lid.

In the foregoing described and depicted arrangements, the heat transfer from the high heat producing components 60 and 65 is conveyed away by way of the dummy components 30 and 35 and ultimately a heat spreader 190. However, the skilled artisan will appreciate other techniques can be used. In this regard, FIG. 11 depicts a pictorial view of the semiconductor chip 15 with the chip stack 20 mounted thereon. The semiconductor chip 15 can be configured as described elsewhere herein and thus include the high heat producing areas 60 and 65 and the low temperature area 70 such that the chip stack 20 is mounted on the low temperature area 70. In lieu of the dummy components 30 and 35, a conformal heat spreader lid 200 can be mounted on the semiconductor chip 15. The lid 200 is shown in section to reveal a top hat design which has a hat portion 205 sized to accommodate the chip stack 20 and a bill portion 210 that extends around the periphery of the hat portion 205 and seats on and establishes thermal contact with both the high heat producing areas 60 and 65 and portions of the low heat producing area 70. The hat portion 205 has an interface surface 207 to seat on the chip stack 20 and another interface 209 to seat on the high heat producing area 65 of the semiconductor chip 15. A suitable thermal interface material (TIM) 215 dispensed from an applicator 217 or otherwise can be positioned between the interface surfaces 207 and 209 and the chip stack 20 and the high heat producing area 65, respectively. The TIM 215 can be an organic TIM of the types described elsewhere herein or even a solder-type TIM (such as indium or the like). The heat spreader lid 200 can be composed of a variety of well-known thermally conducting materials, such as, copper, aluminum, nickel jacketed copper or other types of heat spreader materials. Other configurations, such as bath tub, could be used.

Figure 12:
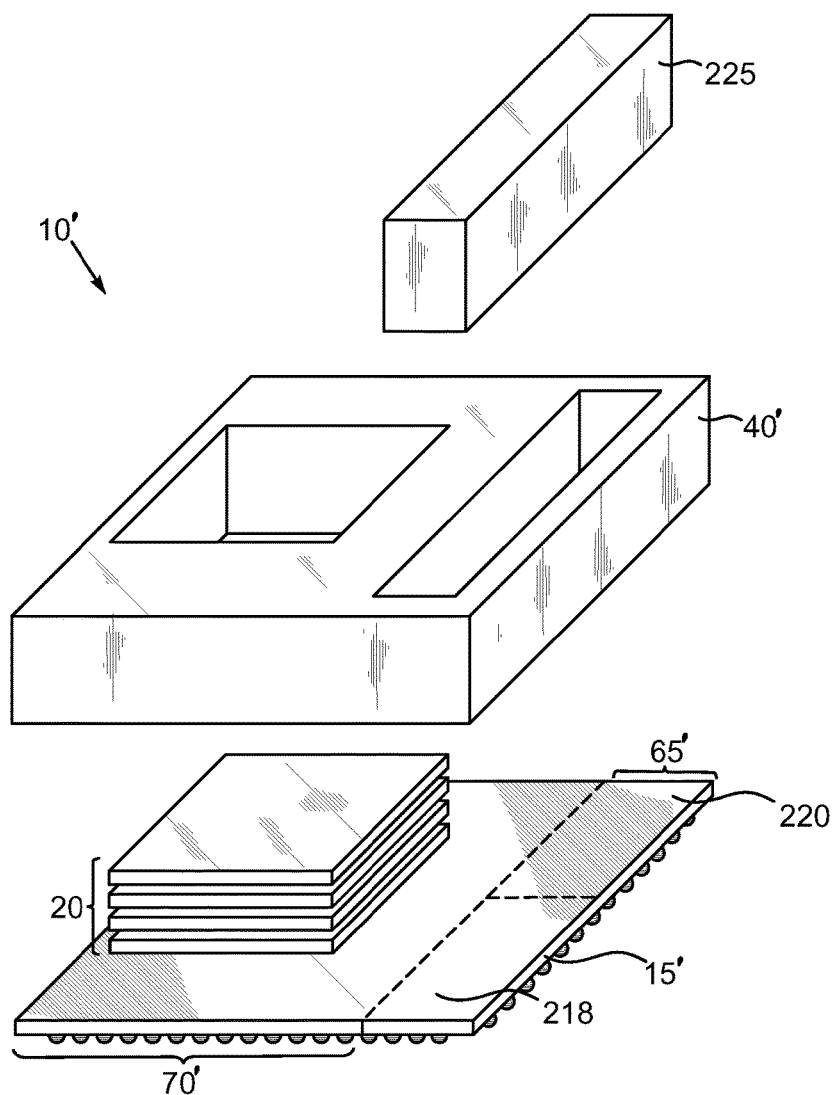
FIG. 12 is a partially pictorial view like FIG. 1, but of an alternate exemplary arrangement.

As noted briefly above, the floor plan of the semiconductor chips that can benefit from segregating high heat producing areas from low heat producing areas can take on a variety of configurations and to accommodate these different floor plans, the dummy components can be shaped in a huge variety of different shapes and sizes to provide the desired heat conducting pathway from the high heat producing area. For example, FIG. 12 depicts a partially exploded pictorial view of an alternate exemplary semiconductor chip device 10' that includes an alternate exemplary of semiconductor chip 15' that has a different floor plan than the semiconductor chip 15 described elsewhere herein. Here, the semiconductor chip 15' has a high heat producing area 65' and a low heat producing area 70' and the chip stack 20 is mounted on the low heat producing area 70'. Here, the high heat producing area 65' is depicted as including two processor cores 218 and 220, but, as noted elsewhere herein, the number of processor cores can be greater than two as desired. A single dummy component 225 can be sized appropriately to mount on the high heat producing area 65' to convey heat away in the manner described elsewhere herein. Both the dummy component 225 and the chip stack 20 can be at least partially encapsulated by a molding material 40' which serves to not only provide a large seating surface for a heat spreader (not shown) but also provides a robust mechanical connection of the dummy component 225 and the semiconductor chip 15'. This arrangement merely represents one of a myriad of possible different types of floor plans and shapes and sizes and numbers of dummy components that can be used for heat transfer purposes.

Figure 13:
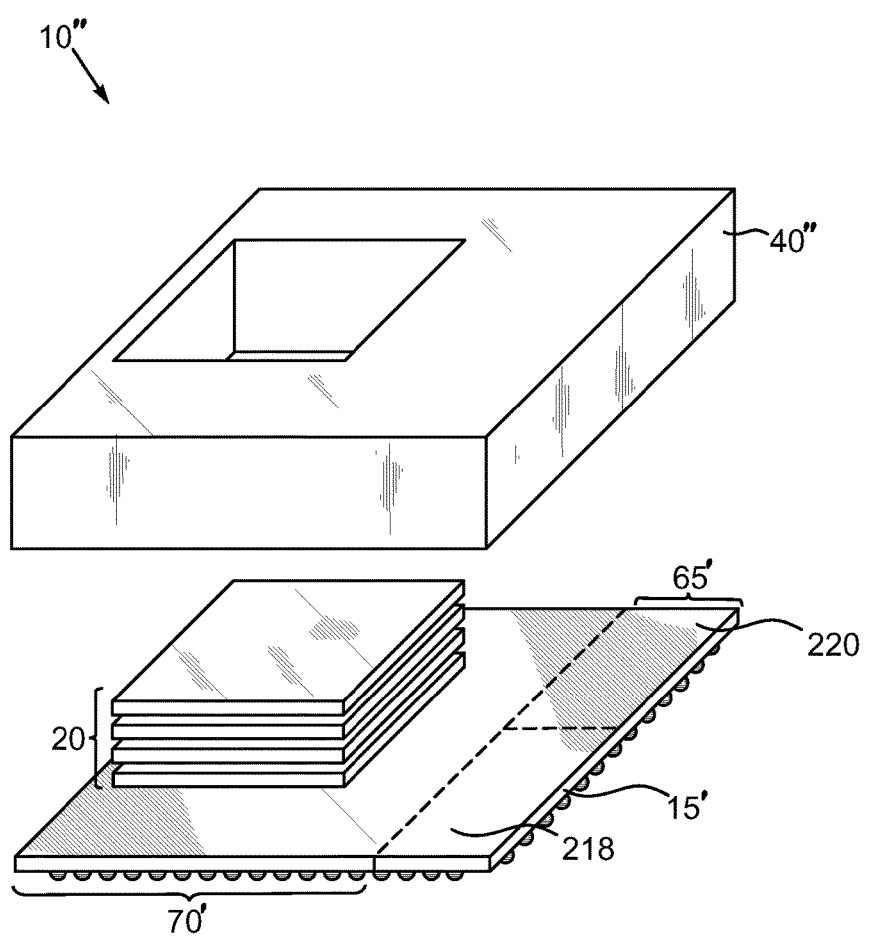
FIG. 13 is another partially pictorial view like FIG. 1, but of an alternate exemplary arrangement.

In another alternate arrangement of an exemplary semiconductor chip device 10" shown in FIG. 13, dummy silicon is swapped out in favor of a molded heat spreader 40". This arrangement is like the arrangement depicted in FIG. 12. The semiconductor chip 15' has a high heat producing area 65' and a low heat producing area 70' and the chip stack 20 is mounted on the low heat producing area 70'. The high heat producing area 65' is depicted as including two logic processor cores 218 and 220, but, as noted elsewhere herein, the number of processor cores can be greater than two as desired. Instead of a single dummy component 225, the molded heat spreader 40" is molded on the high heat producing area 65' and at least partially encapsulates the chip stack 20. The molded heat spreader 40" can be composed of high thermal conductivity molding compounds with various fillers, such as particles of aluminum nitride, Ag, Cu, Pt or the like. Well-known compression molding techniques can be used. One commercial variant is Kyocera XKE-G8483, which has a thermal conductivity of about 3 W/m-K.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:
1. A semiconductor chip device, comprising:
a first semiconductor chip having a side and a floor plan with a high heat producing area and a low heat producing area;
at least one second semiconductor chip stacked on the side and on the low heat producing area; and
means for thermally contacting the side and transferring heat from the high heat producing area.
2. The semiconductor chip device of claim 1, wherein the high heat producing area comprises at least one processor core.
3. The semiconductor chip device of claim 1, wherein the means for thermally contacting the side and transferring heat comprises a dummy component mounted on the high heat producing area.
4. The semiconductor chip device of claim 3, comprising a thermal interface material layer positioned between the dummy component and the first semiconductor chip.
5. The semiconductor chip device of claim 3, comprising a molding material at least partially encapsulating the dummy component and the at least one second semiconductor chip.
6. The semiconductor chip device of claim 1, wherein the means for thermally contacting the side and transferring heat comprises a lid having a first interface surface to seat on the high heat producing area and a second interface surface to seat on the at least one semiconductor chip.
7. The semiconductor chip device of claim 1, wherein the means for thermally contacting the side and transferring heat comprises a molded heat spreader positioned on and in thermal contact with the high generating area.

8. A semiconductor chip device, comprising:
a first semiconductor chip having a floor plan with a high heat producing area and a low heat producing area;
at least one second semiconductor chip stacked on the low heat producing area;
a dummy component mounted on the high heat producing area to transferring heat from the high heat producing area; and
a molding material at least partially encapsulating the dummy component and the at least one second semiconductor chip.

9. The semiconductor chip device of claim 8, comprising a thermal interface material layer positioned between the dummy component and the first semiconductor chip.

10. The semiconductor chip device of claim 8, wherein the high heat producing area comprises at least one processor core.

11. The semiconductor chip device of claim 8, comprising at least one third semiconductor chip mounted on the at least one second semiconductor chip.

12. The semiconductor chip device of claim 11, wherein the at least one second semiconductor chip and the at least one third semiconductor chip comprise memory chips.

13. The semiconductor chip device of claim 8, wherein the first semiconductor chip floor plan includes another high heat producing area that has at least one processor core, the semiconductor chip device including another dummy component mounted on the another high heat producing area.

14. The semiconductor chip device of claim 8, comprising a thermal interface material layer positioned between the dummy component and the first semiconductor chip.

* * * * *